United States Patent [19]

Frenkel

[11] Patent Number: 5,683,967
[45] Date of Patent: Nov. 4, 1997

[54] METHOD FOR INCREASING THE CRITICAL CURRENT DENSITY IN TYPE II SUPERCONDUCTING MATERIALS

[76] Inventor: Anatoly Frenkel, 712 Sperry Dr., Las Vegas, N. Mex. 87701

[21] Appl. No.: 617,488

[22] Filed: Mar. 15, 1996

[51] Int. Cl.⁶ .................................. B05D 3/06; B05D 5/12
[52] U.S. Cl. ...................... 505/320; 505/480; 427/62
[58] Field of Search .......................... 505/320, 480; 427/62, 63

[56] References Cited

PUBLICATIONS

Kumakura et al, J. Appl. Phys. 72(2), Jul. 1992, pp. 800–802.
Kohiki et al, Appl. Phys. A 50 (1990) pp. 509–514.
Metlushko et al, Appl. Phys. Lett. 63(20) Nov. 1993, pp. 2821–2823.
Schuster et al, Phys. Rev. B: Condens. Matter, 47(1) 1993 pp. 373–383.

*Primary Examiner*—Roy V. King
*Attorney, Agent, or Firm*—Samuel M. Freund

[57] ABSTRACT

Method for increasing the critical current density in Type II superconducting materials. The generation of a regular pattern of defects for pinning vortices, where the density of pinning sites is matched to the density of vortices produced by a chosen magnetic field in the particular superconducting material, is described. It is anticipated that such a defect pattern will substantially increase the critical current density carrying capability of the superconducting material so patterned. The fabrication of thick superconductors and conductors having chosen shapes is also described.

12 Claims, 2 Drawing Sheets

METHOD FOR INCREASING THE CRITICAL CURRENT DENSITY IN TYPE II SUPERCONDUCTING MATERIALS

FIELD OF THE INVENTION

The present invention relates generally to increasing the critical current density carrying capacity of superconducting materials and, more particularly, to increasing the critical current density capacity in Type II superconducting materials by introducing regular point defects into films thereof.

BACKGROUND OF THE INVENTION

Increasing the critical current density capacity of high-temperature superconducting materials is important to their widespread application. Currently-available, epitaxially-produced copper oxide thin films can carry current densities, $J_c$, of up to $10^7$ A/cm² at 77K at zero external magnetic field, where $J_c$ exhibits a weak magnetic field dependence. As will be discussed more fully below, this indicates that the high critical current density in such films cannot be attributed to the pinning of vortices. Bulk ceramic and crystalline materials demonstrate 2-3 orders-of-magnitude lower critical current densities, which also must be significantly increased in order to realize large-scale current carrying applications.

The non-bolometric component observed in the pulsed optical photoresponse of high-temperature (Type II) superconducting materials is suggestive that this response is most likely caused by photoactivated flux creep and flux flow. See, e.g., "On the Mechanism of Nonequilibrium Optical Response of High Temperature Superconductors," by A. Frenkel, *Phys. Review B* 48, 9717 (1993), and "High Temperature Superconducting Thin Films as Broadband Optical Detectors," *Physica C* 180, 251 (1991). At equilibrium, fluxons are present in such films which are moved by thermal activation, and optical photons create additional flux creep due to the generation of additional electrons and phonons, which causes additional dissipation. This effect provides strong evidence that for superconducting materials without grain boundaries such as $YBa_2Cu_3O_7$, dissipation properties are likely the result of flux creep and flux flow. See, e.g., "SEM and Electrical Studies of Current Induced Superconducting-Resistive Transitions in $YBa_2Cu_3O_{7-x}$ Thin Films," by A. Frenkel et al., *J. Mater. Res.* 5, 691 (1990), and "Imaging of Current Induced Superconductive-Resistive Transitions by Scanning Electron Microscopy in Laser Deposited Superconducting Thin Films of $YBa_2Cu_3O_{7-x}$," by A. Frenkel et al., *Appl. Phys. Lett.* 55, 911 (1989).

The activation energy, $U_0$, which must be overcome to produce flux motion for low magnetic fields is expressed by:

$$U_0 = H_c^2 \xi_0^3 / 8\pi \quad (1),$$

where $H_c$ is the thermodynamic critical field, and $\xi$ is the coherence length. See, e.g., "Theory of Flux Creep in Hard Superconductors," by P. W. Anderson, *Phys. Rev. Lett.* 9, 309 (1962) and "Hard Superconductivity: Theory of Motion of Abrikosov Flux Lines," by P. W. Anderson et al., *Mod. Phys.* 36, 39 (1964). Using Equation 1 for the activation energy and the Ginsburg-Landau expressions for $H_c$, the activation energy becomes:

$$U_0 = H_{c0}^2 \xi_0^3 / 8\pi (1 - T/T_c)^{-\frac{1}{2}} \quad (2),$$

where $H_{c0}$ is the thermodynamic critical field at 0K, $\xi_0$ is the coherence length at 0K, T is the temperature of the superconducting material, and $T_c$ is the critical temperature thereof. The energy of photons having a wavelength of 1.06 $\xi m$ is approximately 1.2 eV, which is generally larger than $U_0$. It may be shown that thin film devices have a broad, gradual non-linear resistive transition in their I-V curves induced by a bias current. This indicates that $U_0$ is not homogeneous throughout the sample, and has a wide spread of values. The average value of the distribution of such values increases as the temperature of the material decreases and, therefore, the amplitude of the optical response decreases. This effect explains the gradual decrease in the amplitude of the non-bolometric component of the optical pulse response with decreasing temperature below the transition region. These results clearly show that naturally grown thin films exhibit a broad range of activation energies, thereby creating an opportunity for artificially-created, uniformly distributed pinning sites for vortices which will generate uniform, higher activation energies.

It has been demonstrated that it is possible to significantly increase the number of pinning sites or defects, and simultaneously increase the critical current density by increasing the vortex activation energy, $U_0$, using ion irradiation of samples with particles having energies up to 1 GeV. See, e.g., "Enhanced Current Density $J_c$ and Extended Irreversibility in Single-Crystal $Bi_2Sr_2Ca_1Cu_2O_8$ via Linear Defects from Heavy Ion Irradiation," by J. R. Thompson et al., *Appl. Phys. Lett.* 60, 2306 (1992) and "Enchancement of Persistent Currents in $Bi_2Sr_2CaCu_2O_8$ Tapes with Splayed Columnar Defects Induced with 0.8 GeV Protons," by L. Krusin-Elbaum et al., *Appl. Phys. Lett.* 64, 3331 (1994). However, the resulting defect structure is irregular, and the volume of defects occupies only a small portion of the resulting material; that is, the two-dimensional density of defects is much smaller than the density of vortices. However, an increase in the radiation dose, to where the average density of defects approaches the vortex density, results in the destruction of the superconducting properties of the material. See, e.g., FIG. 1 of "Flux-Line Pinning in $Bi_2Sr_2Ca_1Cu_2O_x$ Crystals: Interplay of Intrinsic 2D Behavior and Irradiation-Induced Columnar Defects," by W. Gerhauser et al., *Phys. Rev. Lett.* 68, 879 (1992).

Accordingly, it is an object of the present invention to provide a method for increasing the critical current density carrying capability of Type II superconducting materials by introducing regular defects therein such that the average density of defects approximately equals the vortex density thereof at a chosen magnetic field without damaging the material's superconducting properties.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for increasing the critical current density for Type II superconducting materials may include the steps of: generating a film of a Type II superconducting material, and creating a regular two-dimensional superlattice of point defects in the film.

It is preferred that the step of creating a regular two-dimensional superlattice of point defects in the film includes the use of nanoscale lithography.

Preferably, the density of regular point defects is matched to the flux density of a chosen magnetic field in the film for a particular material, and the size of the defects corresponds to the size of isolated vortices for the material.

In another aspect of the present invention, in accordance with its objects and purposes, the method for increasing the critical current density for Type II superconducting materials, may include the steps of: creating a regular two-dimensional superlattice of point defects in a substrate, and growing a film of Type II superconducting material on the substrate, whereby the regular two-dimensional superlattice of point defects of the substrate is copied into the film.

It is preferred that the step of creating a regular two-dimensional superlattice of point defects in the substrate includes the use of nanoscale lithography.

Preferably, thicker films may be generated by continuing the deposition process even if the defects are not propagated through the film to its surface. In this situation, nanoscale lithography techniques may be used to create a superlattice of point defects on the film surface before additional thickness of film is generated.

Preferably also, the density of regular point defects is matched to the flux density of a chosen magnetic field in the film for a particular material, and the size of the defects corresponds to the size of vortices for the particular material.

Benefits and advantages of the present invention include avoidance of the destruction of the superconducting properties of the materials being processed while increasing the critical currency density carrying capacity of these materials.

BRIEF DESCRIPTION OF THE DRAWINGS

The accompanying drawings, which are incorporated in and form a part of the specification, illustrate the embodiments of the present invention and, together with the description, serve to explain the principles thereof. In the drawings.

DETAILED DESCRIPTION

Briefly, the present invention includes a method for increasing the critical current density capacity in Type II superconducting materials by generating a regular pattern of defects for pinning vortices, where the density of pinning sites is matched to the density of vortices produced by a chosen magnetic field in the particular superconducting material. The method of the present invention contemplates increasing the point defect density in high-quality, crystal-like films, thus creating a superlattice of pinning sites.

Figure 1:
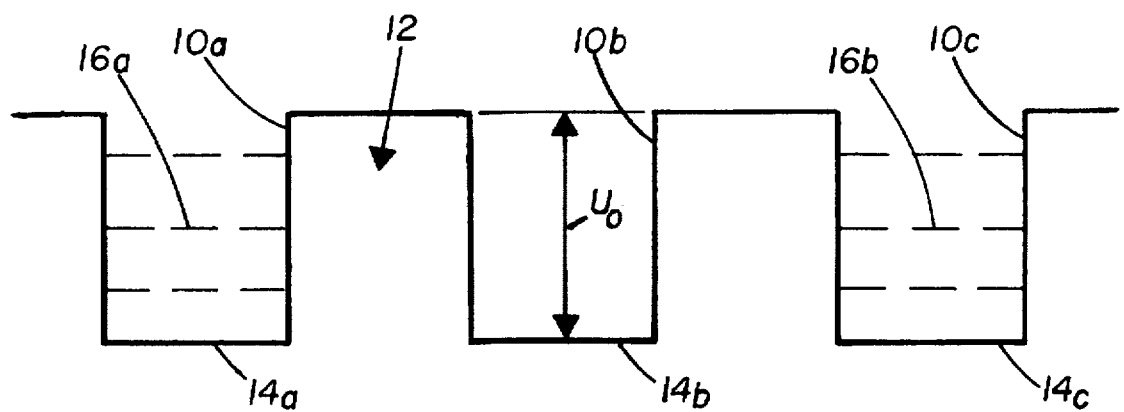
FIG. 1 is a schematic representation of a quantum well superlattice of pinning sites.

Reference will now be made in detail to the present preferred embodiments of the invention, examples of which are illustrated in the accompanying drawings. Similar or identical structure is identified throughout using identical callouts. Turning now to the Figures, FIG. 1 is a schematic representation of a quantum well superlattice of vortex pinning sites, 10a–c, in Type II superconducting material, 12, where the quantum well depth, 14a–c, of undisturbed superconductor is equal to the activation energy $U_0$ defined in Equ. 2, hereinabove. Discrete energy levels, 16a,b, represent vortex core excitation energies. Ideally, the two-dimensional defect density (or inter-defect distance) in a particular superconducting material 12 is matched to the density of vortices generated within the material by magnetic fields to which it is exposed and vortices formed by such fields are pinned on these defect sites, thereby significantly increasing their activation energy. The diameter of the defects is chosen to correspond to the diameter of a vortex in the chosen material. Magnetic fields arise from external sources and from applied bias currents. The critical current density carrying capability of the material will be increased strictly from the flux pinning effects, in contrast to the high current densities carried by epitaxial films, which cannot be attributed to flux pinning because of the low pinning-site density in such materials. See, e.g., "Flux Pinning Mechanism in Films of $YBa_2Cu_3O_x$," by C. Gerber et al., Phys. Rev. B 41, 1169 (1990), "Screw Dislocations in High-$T_c$ Films," by M. Hawley et al., Nature 350, 279 (1991), and "Growth Mechanism of Sputtered Films of $YBa_2Cu_3O_7$ Studied by Scanning Tunneling Microscopy," Science 251, 1587 (1991).

Figure 2:
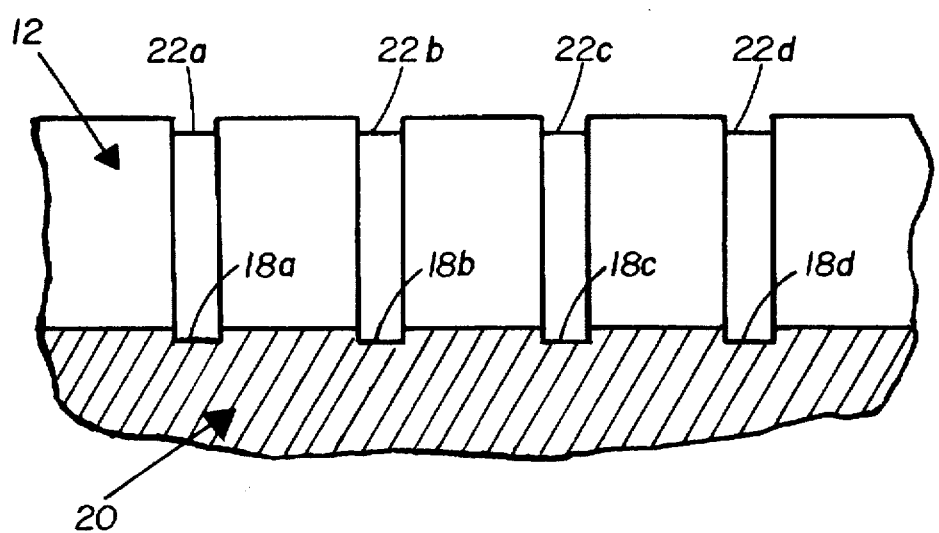
FIG. 2 illustrates the propagation of a defect pattern through the film thickness from a substrate onto which the film is deposited.

Creation of a two-dimensional superlattice of regular point defects may be achieved using nanoscale lithography. Another method for creation of such superlattices is by "defect patterning" of a substrate before the film is generated thereon. Patterning may be achieved in both instances by electron beam lithography (See, e.g., Electron Beam Nanolithography," by C. R. K. Marrian, *Microphysics of Surfaces: Nanoscale Processing*, OSA 1995 Technical Digest Series, Vol. 5, p. 16), by interferometric lithography (See, e.g., "Fabrication and Raman Scattering Studies of One-Dimensional Nanometer Structures in (110) Silicon," by S. H. Zaidi et al., *Appl. Phys. Lett.* 63, 905 (1993)), by ion beam lithography (See, e.g., "Low Energy Focused Ion Beam for Nanofabrication," by K. Gamo, *Microphysics of Surfaces: Nanoscale Processing*, OSA Technical Digest Series, Vol. 5, p. 19), by other developing technologies in nanolithography (See, e.g., *Physics of Nanostructures*, Ed. by J. H. Davis and A. R. Long, AOP Institute of Physics, 1993 and *Nanostructures and Mesoscopic Systems* by Kirk and Reed, Academic Press, 1992), or by a combination of these techniques. The general "defect patterning" process is illustrated in FIG. 2 hereof. Pattern, 18a–d, is produced on substrate, 20, before film 12 is generated thereon. It is anticipated that film 12 will copy the pattern of the substrate through the thickness of the film as defects 10a–d. Preliminary studies have shown this to be the case (See, e.g., "Effect of Substrate Smoothness on the Microstructure of $YBa_2Cu_3O_7/Y_2O_3/YBa_2Cu_3O_7$ Trilayers," by G. L. Waytena et al., J. Electron. Mat. 24, 189 (1995)). The thickness of the film would be determined by the particular method employed to generate the pattern of pinning sites and the desired superconducting properties of the resulting material. Thicker films may be generated by continuing the film generation process for an already patterned film until the defect pattern no longer appears on the surface thereof, repatterning the surface using nanolithographic techniques, and again generating film until a desired film thickness is obtained.

Figure 3B:
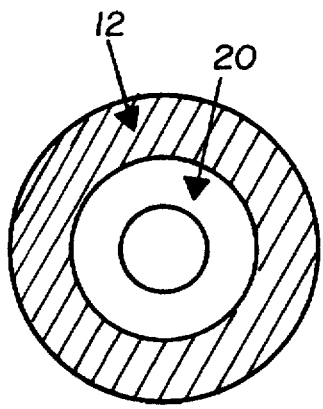
FIGS. 3a and 3b illustrate the generation of a cylindrical superconductor using the method of the present invention to generate a film on a solid or hollow cylindrical substrate.
Figure 3A:
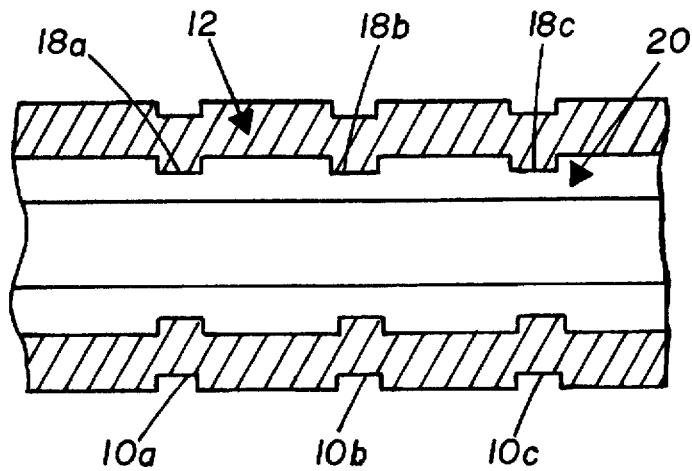
Figure 4:
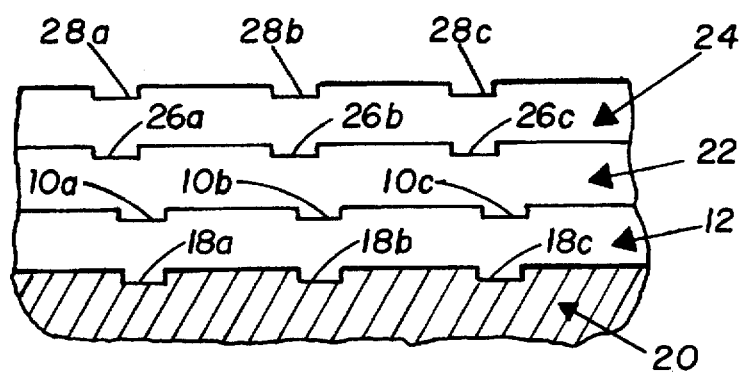
FIG. 4 illustrates the generation of a multilayer structure of superconducting films, where a high defect density pattern has been introduced into each layer, using the method of the present invention.

Extension of the method of the present invention to other shapes, such as cylindrically-shaped conductors, may be achieved by creating a two-dimensional nanoscale defect pattern on a substrate and growing a thick film thereon which will propagate these defects through the thickness of the film. FIGS. 3 and 4 hereof illustrate this process. FIGS. 3a and 3b illustrate an example of how one would produce a cylindrical conductor. FIG. 3a shows a side view of solid or hollow cylindrical substrate, 20, onto the outer surface of which a desired defect pattern, 18a–c, is produced. Film, 12, generated thereon propagates this defect pattern through its thickness, thereby creating a superlattice of pinning sites, 10a–c, perpendicular to the direction of any desired current flow therein. FIG. 3b illustrates a cross section of the conductor shown in FIG. 3a. FIG. 4 hereof illustrates an example of a multilayer structure, where each film surface is patterned to provide a high defect (pinning site) density. Shown is substrate 20 onto which films 12, 22, and 24 have been generated. As illustrated, film 12 has defects 10a–c appearing at its surface in response to substrate defects 18a–c. It may be the case, however, and as described hereinabove for the situation where the films are generated without a substrate, that for a desired film thickness, the defects do not propagate through to the surface of the film. In this situation, patterning by nanolithography of the film surface is necessary before additional thicknesses of film may be deposited. Thus, the surface of film, 22, has newly formed defects, 26a–c, thereon in order to add film, 24, thereonto. Defects, 28a–c, are produced as a result of the generation of film 24 onto film 22 having defects 26a–c. It should be mentioned that a different pinning site density or pattern, 26a–c, may be introduced into a thick film by this procedure. Additionally, it is believed by the inventor that the defects need not penetrate to the surface of a given layer in order to effectively pin vortices.

The foregoing description of the invention has been presented for purposes of illustration and description and is not intended to be exhaustive or to limit the invention to the precise form disclosed, and obviously many modifications and variations are possible in light of the above teaching. For example, it has been shown that by increasing the pinning site density one can create picosecond response time detectors which are responsive over a broad range of wavelengths of electromagnetic radiation (ultraviolet to infrared). See, e.g., Frenkel (1993), supra. A superlattice of vortices could be excited almost to the top of the quantum well (See FIG. 1 hereof) by applying a magnetic field, either externally or through a bias current, so that the vortices remain pinned to the defect sites, but their activation energies are significantly reduced. The small energy supplied by an optical pulse through a photon-electron-photon-vortex transition would then be sufficient to cause the affected vortex to move and dissipate. This increase in nonequilibrium flux dissipation should substantially increase the responsivity of the detector.

Additionally, multiple-layer structures having different materials in each layer may be fabricated according to the teachings of the present invention.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for increasing the critical current density in Type II superconducting materials, which comprises the steps of:

a. generating a film of a Type II superconducting material; and b. creating a regular two-dimensional superlattice of point defects in the film using nanoscale lithography.

2. The method for increasing the critical current density in Type II superconducting materials as described in claim 1, wherein the density of regular point defects in the film is matched to the flux density of a chosen magnetic field in the film of the superconducting material.

3. The method for increasing the critical current density in Type II superconducting materials as described in claim 1, wherein the diameter of the regular point defects in the film is chosen to correspond to the diameter of vortices in the superconducting material.

4. A method for increasing the critical current density in Type II superconducting materials, which comprises the steps of:

a. creating a regular two-dimensional superlattice of point defects on the surface of a substrate; and b. growing a film of Type II superconducting material on the substrate, whereby the regular two-dimensional superlattice of point defects of the substrate is copied onto the film.

5. The method for increasing the critical current density in Type II superconducting materials as described in claim 4, wherein said step of creating a regular two-dimensional superlattice of point defects in the substrate includes the use of nanoscale lithography.

6. The method for increasing the critical current density in Type II superconducting materials as described in claim 4, wherein the density of regular point defects in the substrate is matched to the flux density of a chosen magnetic field in the film of the superconducting material.

7. The method for increasing the critical current density in Type II superconducting materials as described in claim 4, wherein the diameter of the regular point defects in the film is chosen to correspond to the diameter of vortices in the superconducting material.

8. A method for increasing the critical current density in Type II superconducting materials, which comprises the steps of:

a. creating a first, regular two-dimensional superlattice of point defects on the surface of a substrate;

b. growing a first, film of Type II superconducting material on the substrate, whereby the first, regular two-dimensional superlattice of point defects is copied into the film, but not through to the surface thereof;

c. creating a second, regular two-dimensional superlattice of point defects on the surface of the film; and d. growing a second, Type II superconducting material film on the first film in such a manner that the second, regular two-dimensional superlattice of point defects is copied therein, whereby a desired thickness of high-temperature superconducting material is achieved.

9. The method for increasing the critical current density in Type II superconducting materials as described in claim 8, wherein said step of creating regular two-dimensional superlattices of point defects in the substrate includes the use of nanoscale lithography.

10. The method for increasing the critical current density in Type II superconducting materials as described in claim 8, wherein the density of regular point defects in the substrate and in each film deposited thereon is matched to the flux density of a chosen magnetic field in the film of the superconducting material.

11. The method for increasing the critical current density in Type II superconducting materials as described in claim 8, wherein the substrate is a hollow, cylindrical-shaped substrate; whereby a round conductor is fabricated.

12. The method for increasing the critical current density in Type II superconducting materials as described in claim 8, wherein the diameter of the regular point defects in the film is chosen to correspond to the diameter of vortices in the superconducting material.

* * * * *